(12) United States Patent
Wang et al.

(10) Patent No.: US 10,573,602 B2
(45) Date of Patent: Feb. 25, 2020

(54) SEMICONDUCTOR DEVICE AND METHOD OF FORMING THE SAME

(71) Applicant: NANYA TECHNOLOGY CORPORATION, New Taipei (TW)

(72) Inventors: Mao-Ying Wang, New Taipei (TW); Pei-Lin Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/015,559

(22) Filed: Jun. 22, 2018

(65) Prior Publication Data
US 2019/0393160 A1    Dec. 26, 2019

(51) Int. Cl.
*H01L 23/552* (2006.01)
*H01L 23/00* (2006.01)
*H01L 23/522* (2006.01)

(52) U.S. Cl.
CPC ........ *H01L 23/552* (2013.01); *H01L 23/5225* (2013.01); *H01L 23/5226* (2013.01); *H01L 24/05* (2013.01); *H01L 2224/023* (2013.01); *H01L 2224/0233* (2013.01); *H01L 2224/02373* (2013.01); *H01L 2224/02381* (2013.01); *H01L 2224/04042* (2013.01); *H01L 2224/0557* (2013.01); *H01L 2224/05093* (2013.01); *H01L 2224/05564* (2013.01); *H01L 2224/05569* (2013.01)

(58) Field of Classification Search
CPC ............... H01L 23/552; H01L 24/05; H01L 2224/02381; H01L 2224/04042; H01L 2224/05093; H01L 2224/05564; H01L 2224/05569; H01L 23/5225; H01L 23/5226; H01L 2224/023; H01L 2224/0233; H01L 2224/02373; H01L 2224/0557

See application file for complete search history.

(56) References Cited

U.S. PATENT DOCUMENTS

| | | | | |
|---|---|---|---|---|
| 10,217,726 | B1 * | 2/2019 | Nakano | ............... H01L 23/5227 |
| 2001/0041548 | A1 * | 11/2001 | Bult | ....................... H03F 3/195 |
| | | | | 455/252.1 |
| 2004/0245640 | A1 * | 12/2004 | Tsukamoto | ........... H01L 23/552 |
| | | | | 257/758 |
| 2009/0236701 | A1 * | 9/2009 | Sun | ..................... G06F 17/5036 |
| | | | | 257/665 |

(Continued)

FOREIGN PATENT DOCUMENTS

| | | |
|---|---|---|
| CN | 103972212 A | 8/2014 |
| TW | 200941601 A | 10/2009 |

(Continued)

OTHER PUBLICATIONS

Office Action of TW107125697, dated Oct. 3, 2019, 12 pages.

*Primary Examiner* — Feifei Yeung Lopez
(74) *Attorney, Agent, or Firm* — Muncy, Geissler, Olds & Lowe, P.C.

(57) ABSTRACT

The present disclosure provides a semiconductor device. The semiconductor device includes a first die and a conductive layer. The first die is to be bonded with, in a direction, a second die external to the semiconductor device. The conductive layer, between the first die and the second die in the direction, has a reference ground.

14 Claims, 13 Drawing Sheets

(56) References Cited

U.S. PATENT DOCUMENTS

| | | | | |
|---|---|---|---|---|
| 2009/0278244 A1* | 11/2009 | Dunne | ................ | H01L 23/481 257/676 |
| 2010/0078778 A1* | 4/2010 | Barth | .................... | H01L 21/568 257/659 |
| 2013/0037965 A1* | 2/2013 | Morimoto | ........... | H01L 23/5286 257/774 |
| 2015/0106574 A1* | 4/2015 | Jayasena | ............. | G06F 15/7821 711/154 |
| 2017/0263570 A1* | 9/2017 | Lin | ..................... | H01L 25/0657 |

FOREIGN PATENT DOCUMENTS

| | | |
|---|---|---|
| TW | 201803043 A | 1/2018 |
| TW | 201810555 A | 3/2018 |

\* cited by examiner

SEMICONDUCTOR DEVICE AND METHOD OF FORMING THE SAME

TECHNICAL FIELD

The present disclosure relates to a semiconductor device and a method of forming the same, and more particularly, to a semiconductor device for a system in package.

DISCUSSION OF THE BACKGROUND

A system in package (SiP) is a number of integrated circuits enclosed in a single module (package). The SiP performs all or most functions of an electronic system, and is typically used inside a mobile phone, digital music player, or other electronic device. Dies containing integrated circuits may be stacked vertically on a substrate. The dies are internally connected to each other by bonding wires. SiP solutions may include multiple packaging technologies, such as flip chip, wire bonding, wafer-level packaging and more.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a first die and a conductive layer. The first die is configured to be bonded with, in a direction, a second die external to the semiconductor device. The conductive layer, between the first die and the second die in the direction, is configured to implement a reference ground.

In some embodiments, the conductive layer occupies a projection area. The projection area is defined by projecting the second die to be bonded with the first die onto the first die.

In some embodiments, the semiconductor device further includes a redistribution structure. The redistribution structure, configured for routing the first die, surrounds and covers the conductive layer.

In some embodiments, the conductive layer is a first conductive layer. The redistribution structure includes a second conductive layer. The second conductive layer is configured to be electrically isolated from the first conductive layer when the second conductive layer carries a signal other than the reference ground.

In some embodiments, the conductive layer is a first conductive layer. The redistribution structure includes a second conductive layer. The second conductive layer is configured to be coupled to the first conductive layer when the second conductive layer carries the reference ground.

In some embodiments, the redistribution structure further includes a dielectric layer on the conductive layer. The semiconductor device further includes a via. The via, in the dielectric layer, is configured to couple the first conductive layer to the second conductive layer In some embodiments, the conductive layer extends out of a projection area. The projection area is defined by projecting the second die to be bonded with the first die onto the first die.

In some embodiments, the first die includes a passivation layer, wherein the conductive layer is disposed on the passivation layer.

In some embodiments, the conductive layer includes Cu, and the conductive layer has a mesh structure.

Another aspect of the present disclosure provides a semiconductor device. The semiconductor device includes a first die, a conductive layer and a redistribution structure. The conductive layer, extending and disposed on the first die, configured to implement a reference ground. The redistribution structure covers and surrounds the conductive layer.

In some embodiments, the conductive layer is a first conductive layer. The redistribution structure includes a dielectric layer and a second conductive layer. The dielectric layer covers the conductive layer. The second conductive layer is disposed on the dielectric layer. The semiconductor device further includes a via. The via is disposed in the dielectric layer. The second conductive layer provides the reference ground to the first conductive layer via the via.

In some embodiments, the first die includes a passivation layer on a top surface of the first die, and the passivation layer is in contact with the conductive layer.

Another aspect of the present disclosure provides a method. The method includes providing a first die, and forming a conductive layer on the first die and between the first die and a second die to be bonded with the first die.

In some embodiments, the method further includes forming a redistribution structure covering the conductive layer.

In some embodiments, the method further includes forming the conductive layer on the first die in a projection area, wherein the projection area is defined by projecting the second die to be bonded with the first die onto the first die.

In the comparative semiconductor device, if both the first die and the second die operate at a relatively high operation frequency at the same time, the first die and the second die exhibit a radio frequency (RF) interference with each other.

In the present disclosure, the conductive layer is able to effectively shield the first die from the second die. As a result, even though the first die and the second die operate at the relatively high operation frequency at the same time, the first die no longer receives the RF interference from the second die. Moreover, there is no need to significantly modify a circuit design. The original circuit design can still be used, with the only changes being the addition of the conductive layer and the via, which reduces the burden on a circuit designer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
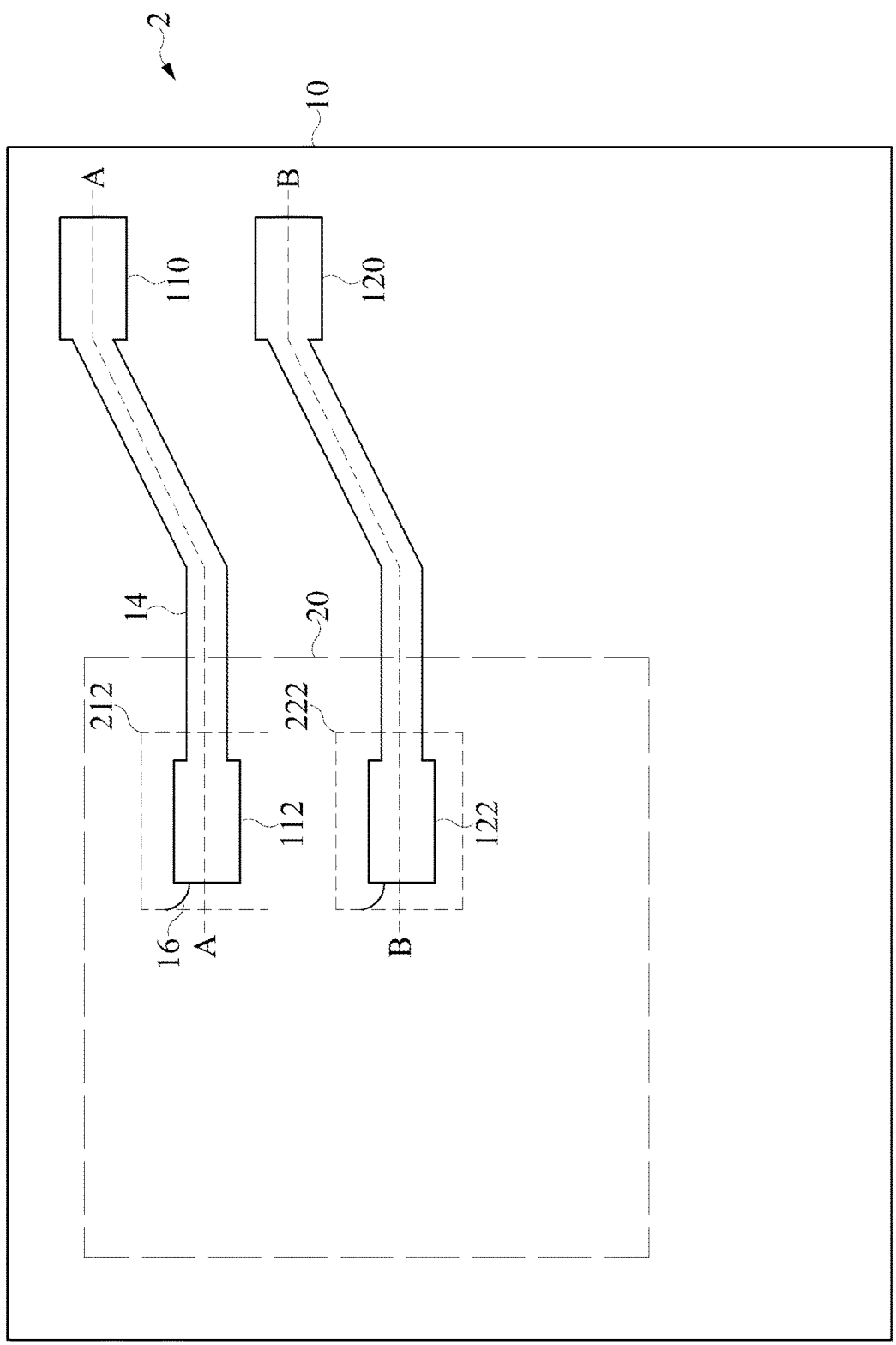
FIG. 1 is a schematic diagram of a comparative packaged semiconductor device.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a comparative packaged semiconductor device 1. Referring to FIG. 1, the comparative packaged semiconductor device 1 includes a semiconductor device 2 including a first die 10, and a second die 20 external to the semiconductor device 2.

The first die 10 includes, for example, a dynamic random access memory (DRAM). In some implementations, the first die 10 may include logic dies (e.g., central processing unit, microcontroller), memory dies (e.g., static random access memory (SRAM) die), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), or a combination thereof.

The second die 20 is, in a direction (for example, a vertical direction), stacked on and bonded to the first die 10 by, for example, system in package (SiP) technologies. In some implementations, the second die 20 is bonded to the first die 10 by, for example, direct surface bonding, metal-to-metal bonding, hybrid bonding, or another bonding process. The second die 20 includes, for example, a system on chip (SoC). The second die 20 may perform functions different from those performed by the first die 10. An area of the second die 20 in the present comparative example is less than that of the first die 10. However, the present disclosure is not limited thereto. In some implementations, the second die 20 may include logic dies (e.g., central processing unit, microcontroller), memory dies (e.g., static random access memory (SRAM) die), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), or a combination thereof.

The first die 10 communicates with the second die 20 via pads 110, 112, 120 and 122 on the first die 10 and pads 212 and 222 on the second die 20. For brevity and clarity, only four pads 110, 112, 120 and 122 are depicted. However, the present disclosure is not limited thereto.

In further detail, the first die 10 communicates a reference ground with the second die 20 via the pads 110 and 212, respectively, on the first and second dies 10 and 20. However, the pad 110 may be disposed far apart from the pad 212. If the pad 110 is bonded directly to the pad 212, a wire having a relatively great length is required to bond the pad 110 to the pad 212. Such a wire may lead to an adverse effect. To address such issue, the pad 112, and a redistribution structure 14 of the semiconductor device 2 are introduced, wherein the redistribution structure 14 is configured for routing the first die 10, which will be illustrated in detail with reference to FIG. 2. By way of the redistribution structure 14, which will be illustrated in detail with reference to FIG. 2, the pad 110 provides the reference ground to the pad 112, which is relatively close to the pad 212 compared to the pad 110.

Similarly, the first die 10 communicates a signal other than the reference ground with the second die 20 via the pads 120 and 222, respectively, on the first and second dies 10 and 20. The signal, for example, includes data signal, clock signal, or other suitable signals. To address the issue mentioned above, by way of the redistribution structure 14, the pad 120 provides the signal to the pad 122, which is relatively close to the pad 222 compared to the pad 120.

In operation, if both the first die 10 and the second die 20 operate at a relatively high operation frequency, the first die 10 and the second die 20 exhibit a radio frequency (RF) interference with each other. Theoretically, a possible approach to eliminating such RF interference is to adjust operation frequencies of the first die 10 and the second die 20, such that the first die 10 and the second die 20 operate at the high operation frequency at different times, for example, in a staggered manner. However, such approach is difficult or impossible to implement. Further, without significantly modifying a circuit design of the semiconductor device 2, for example, changing a layout and/or a circuit structure, it is difficult or impossible to eliminate or alleviate an RF interference.

Figure 2:
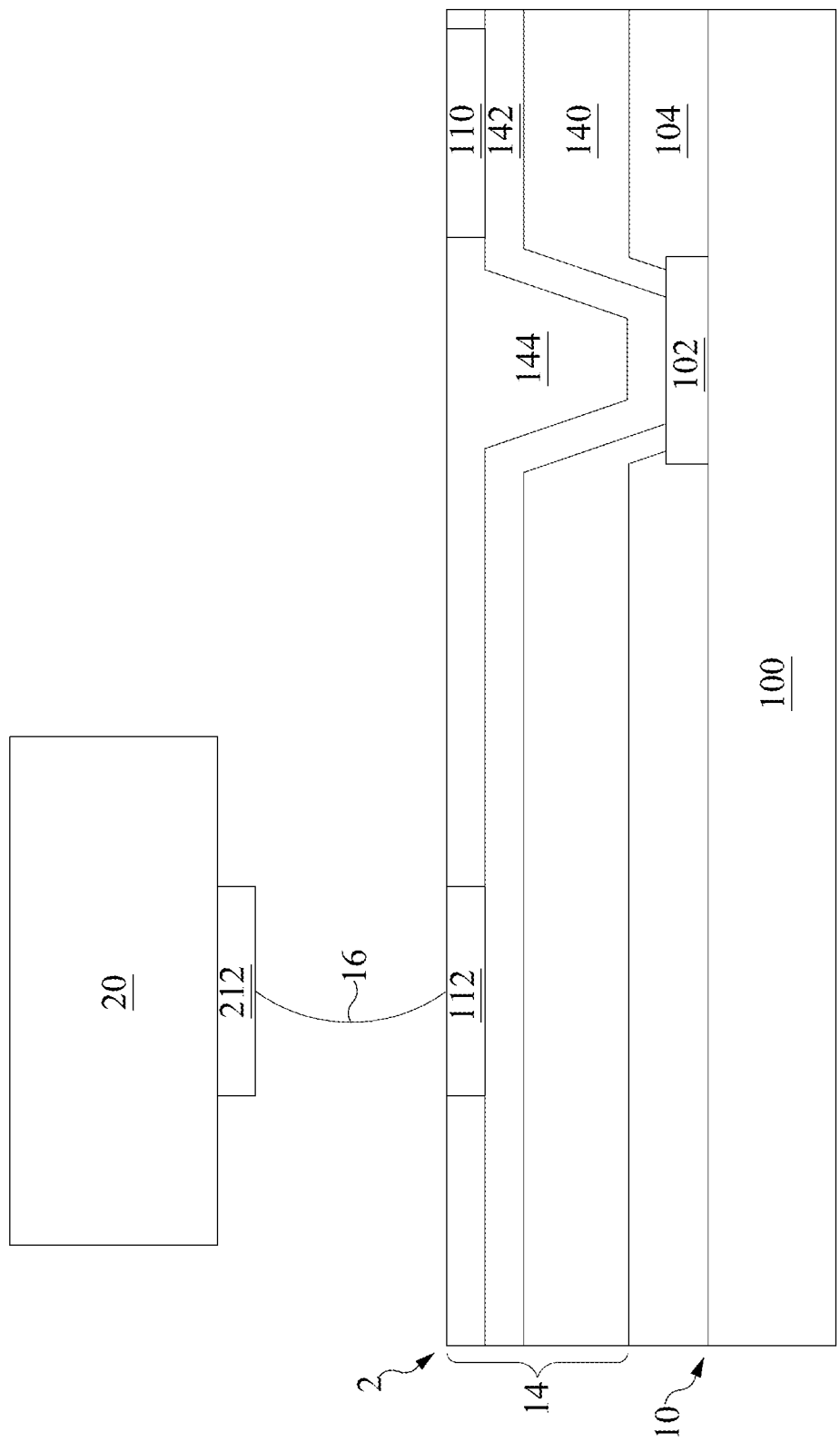
FIG. 2 is a cross-sectional diagram of the comparative packaged semiconductor device shown in FIG. 1 taken along a line A-A.

FIG. 2 is a cross-sectional diagram of the comparative packaged semiconductor device 1 shown in FIG. 1 taken along a line A-A. Referring to FIG. 2, the first die 10 includes a substrate 100, a pad 102 and a passivation layer 104.

The substrate 100 may include, for example, bulk silicon, doped or un-doped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates, may also be used. In another implementation, the substrate 100 may comprise a substrate to which an integrated circuit die may be attached. For example, the substrate 100 may include an interposer, a packaging substrate, a high-density interconnect, a printed circuit board, another integrated circuit die, or the like.

It should be noted that in some implementations, particularly in implementations in which the substrate 100 comprises an integrated circuit die, the substrate 100 may include electrical circuitry (not shown). In an implementation, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative implementations and are not meant to limit the disclosure in any manner Other circuitry may be used as appropriate for a given application. In the case where the substrate 100 is an interposer, the interposer may include passive elements, active elements, both active elements and passive elements, or neither.

Additionally, the substrate 100 may be a wafer upon which multiple dies may be formed and then separated, thereby forming individual integrated circuit dies. As such, the figures illustrate a single die for ease of illustration while it is understood that the die may be fabricated as part of a wafer.

The pad 102 is provided in an upper surface of the substrate 100 to provide external electrical connections. In the present disclosure, the pad 102 is in a metal-3 (M3) layer. However, the present disclosure is not limited thereto. It should be noted that the pad 102 may represent an electrical connection to electrical circuitry formed on the substrate 100. The pad 102 may comprise a conductive material such as copper, although other conductive materials, such as tungsten, aluminum, or a copper alloy, may alternatively be used. The pad 102 may be formed by any suitable process, such as a deposition and etching, damascene or dual damascene, or the like, with any suitable conductive material, such as aluminum.

A passivation layer 104 may be formed of a dielectric material, such as polyimide (PI), polymer, an oxide, a nitride, or the like, and patterned over the surface of the substrate 100 to provide an opening over the pad 102 and to protect the underlying layers from various environmental contaminants. In an embodiment, the passivation layer 104 comprises a composite layer of a silicon nitride layer and an oxide layer. The silicon nitride layer may be formed using chemical vapor deposition (CVD) techniques using silane and ammonia as precursor gases to a thickness of about 2000 Å. The oxide layer may be formed by any oxidation process, such as wet or dry thermal oxidation in an ambient environment comprising an oxide, H2O, NO, or a combination thereof, or by CVD techniques using tetra-ethyl-ortho-silicate (TEOS) and oxygen as a precursor.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, additional passivation layers, and the like, may be present. A single layer of conductive/bond pads and a passivation layer are shown for illustrative purposes only. Other embodiments may include any number of conductive layers and/or passivation layers. The above description is meant only to provide a context for embodiments discussed herein and is not meant to limit the disclosure or the scope of any claims to those specific embodiments.

Still referring to FIG. 2, the redistribution structure 14 includes a dielectric layer 140, a conductive layer 142 and a dielectric layer 144.

The dielectric layer 140 is formed over the passivation layer 104. The dielectric layer 140 acts as a mold for forming conductive pillars or vias in subsequent processing steps. In an implementation, the dielectric layer 140 includes a polymer such as an epoxy, polyimide (PI), benzocyclobutene (BCB), polybenzoxazole (PBO), and the like. In an implementation in which the polymer layer is, for example, PBO, the polymer layer may be formed by spin coating to a thickness of about 2 μm to about 5 μm, for example, and patterned using photolithography techniques. PBO is a photosensitive material and may be patterned by exposing the PBO layer in accordance with a desired pattern, developing, and curing.

As shown in FIG. 2, a conductive layer 142 is formed over the surface of the dielectric layer 140 and exposed portions of the pad 102. In an implementation, the conductive layer 142 may be formed by depositing a thin conductive layer, such as a thin layer of Ti, Ta, Cu, TiN, TaN, and/or the like, using CVD or PVD techniques. For example, in an implementation, the conductive layer 142 comprises a layer of Ti deposited by a PVD process.

The dielectric layer 144 has the same material as the dielectric layer 140. Therefore, for brevity, the detailed descriptions are omitted herein.

Although two dielectric layers 140 and 144 are explicitly illustrated, the redistribution structure 14 may further include any number of dielectric layers having conductive features disposed therein, depending on package design.

The pad 112 is formed on the redistribution structure 14, and is coupled to the pad 212 on the second die 20 via a wire 16 after a wire-bonding process. Also, the pad 110 is formed on the redistribution structure 14.

A cross-sectional view of the packaged semiconductor device 1 taken along a line B-B is similar to that shown in FIG. 2 except that, the pads 112 and 212 are replaced with the pads 122 and 222. Therefore, such cross-sectional view is omitted for brevity.

Figure 3:
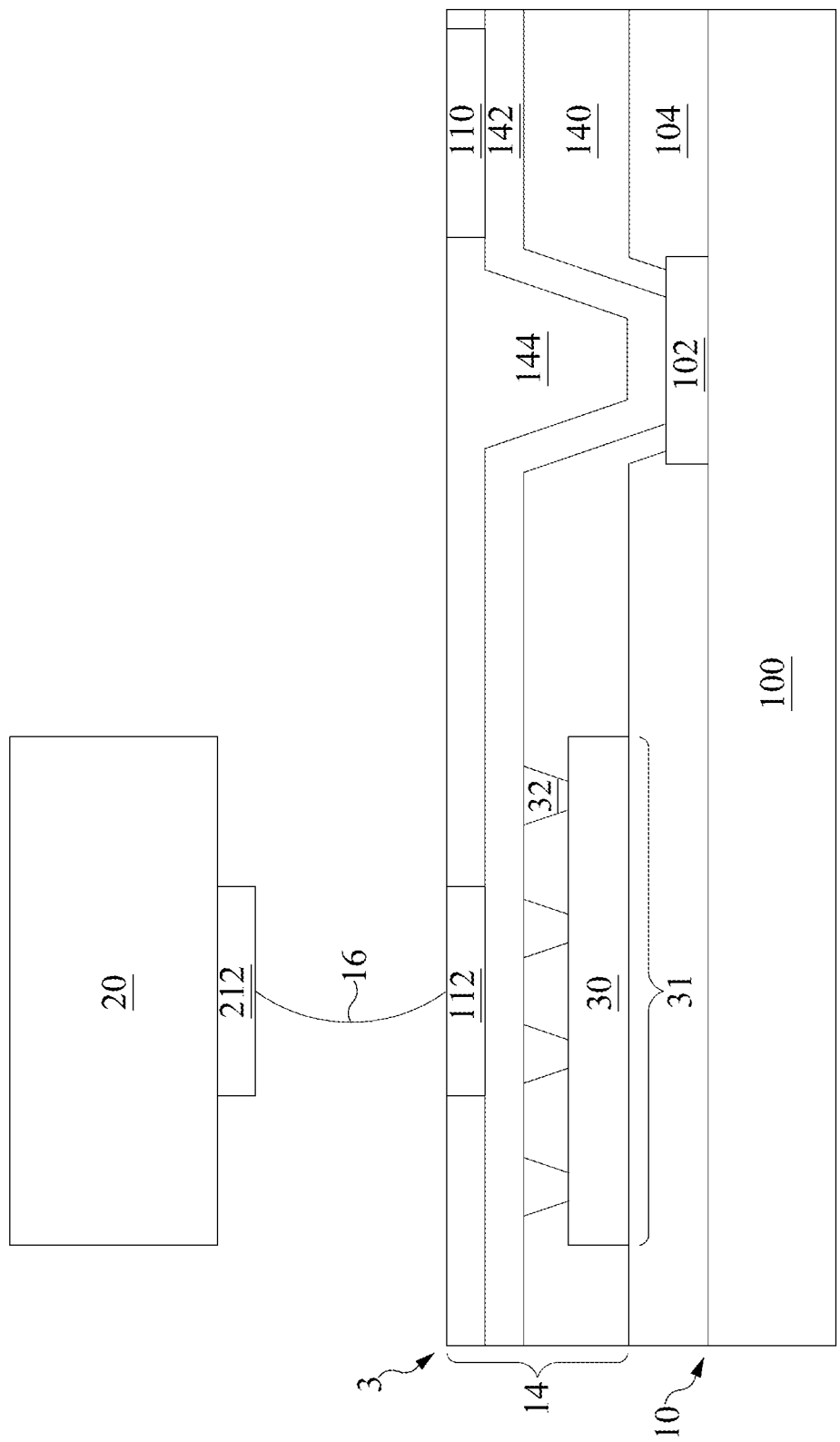
FIG. 3 is a cross-sectional diagram of a packaged semiconductor device taken along a same line as the line A-A shown in FIG. 1, in accordance with some embodiments of the present disclosure.

FIG. 3 is a cross-sectional diagram of a packaged semiconductor device including a semiconductor device 3 taken along a same line as a line A-A shown in FIG. 1, in accordance with some embodiments of the present disclosure. Referring to FIG. 3, the semiconductor device 3 is similar to the semiconductor device 2 described and illustrated with reference to FIG. 2 except that, for example, the semiconductor device 3 includes a conductive layer 30 on the passivation layer 104, and a via 32.

The conductive layer 30, between the first die 10 and the second die 20 in a direction in which the first die 10 is to be bonded to the second die 20, functions to shield the first die 10 from the second die 20, as will be described in detail below. The conductive layer 30 is disposed on, extends on and, in some embodiments, in contact with the passivation layer 104. In addition, the conductive layer 30 is surrounded by and covered by the redistribution structure 14. In further detail, the conductive layer 30 is covered by the dielectric layer 140. In some embodiments, the conductive layer 30 includes Cu, and the conductive layer 30 has a mesh structure. Typically, an object consisting of Cu can tolerate only a small stress. However, because of the mesh structure of the present disclosure, stress on the conductive layer 30 can be alleviated, thereby protecting the structure of the conductive layer 30 from being cracked.

The conductive layer 30 occupies only a projection area 31. The projection area 31 is defined by projecting the second die 20, which is to be bonded with the first die 10, onto the first die 10. The conductive layer 30 does not extend out of the projection area 31.

The via 32, in the dielectric layer 140, functions to couple the conductive layer 30 to the conductive layer 142.

As previously mentioned, the pad 110 is used to transmit the reference ground to the first die 10 via the pad 102. In this case, the pad 102 serves as a ground pad. Moreover, the pad 110 is used to transmit the reference ground to the second die 20 via the pad 212 as well. In further detail, the pad 110 is short-circuited to the conductive layer 142. The conductive layer 142 carries the reference ground, and provides the reference ground to the conductive layer 30 via the via 32. Consequently, the conductive layer 30 has or implement the reference ground.

Because the conductive layer 30 has the reference ground and the conductive layer 30 occupies the projection area 31, the conductive layer 30 is able to effectively shield the first die 10 from the second die 20. As a result, even though the first die 10 and the second die 20 operate at the relatively high operation frequency at the same time, the first die 10 no longer exhibits the RF interference from the second die 20.

Moreover, there is no need to significantly modify a circuit design. The original circuit design can still be used, with the only changes being the addition of the conductive layer 30 and the via 32, which reduces the burden on a circuit designer.

Figure 4:
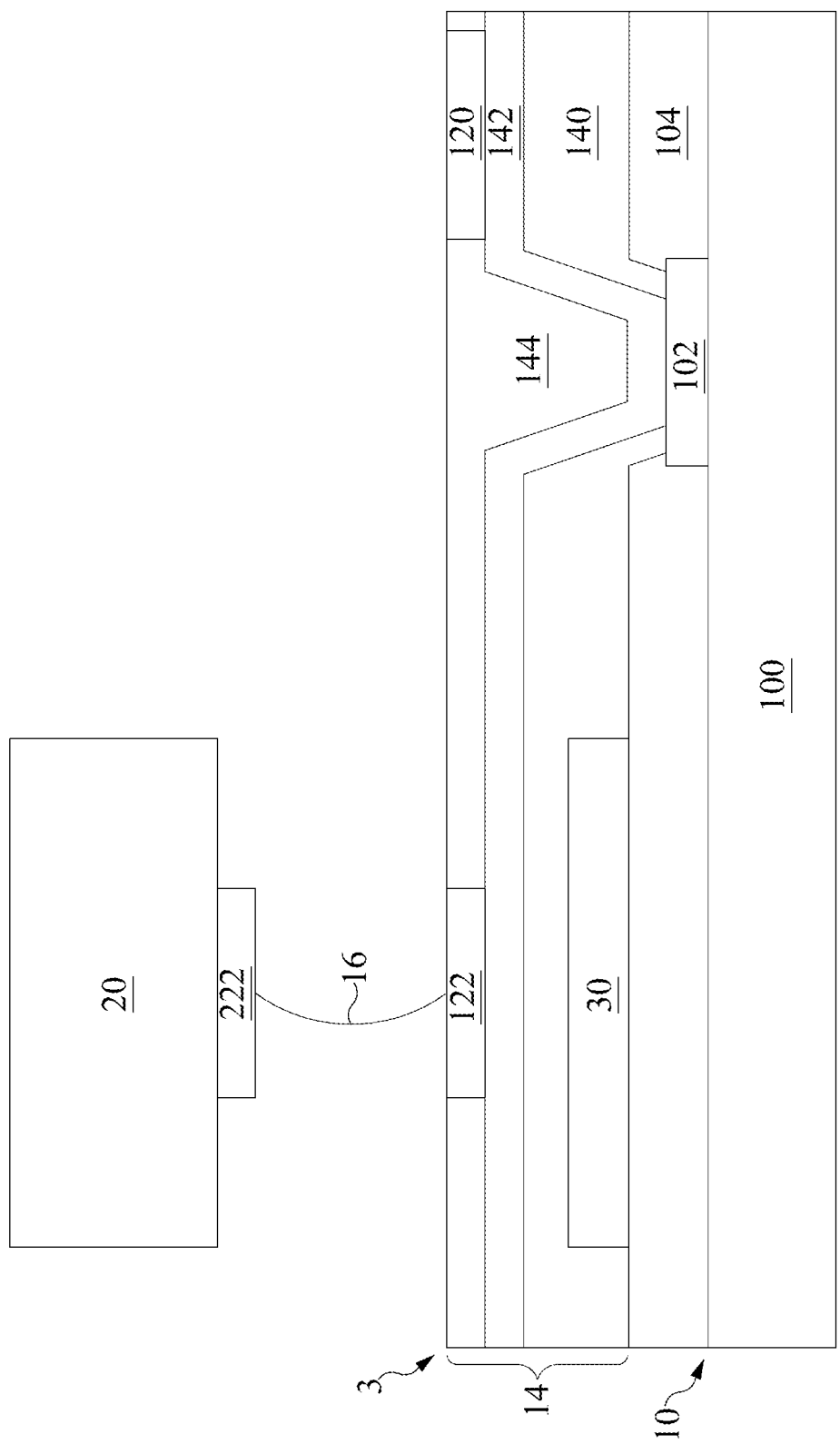
FIG. 4 is a cross-sectional diagram of the packaged semiconductor device shown in FIG. 3 taken along a same line as a line B-B shown in FIG. 1, in accordance with some embodiments of the present disclosure.

FIG. 4 is a cross-sectional diagram of the packaged semiconductor device shown in FIG. 3 taken along a same line as the line B-B shown in FIG. 1, in accordance with some embodiments of the present disclosure. Referring to FIG. 4, as previously mentioned, the pad 120 is used to transmit the signal other than the reference ground to the first die 10 via the pad 102. In this case, the pad 102 serves as a signal pad. Moreover, the pad 120 is used to transmit the signal to the second die 20 via the pad 212 as well. In further detail, the pad 120 is short-circuited to the conductive layer 142. The conductive layer 142 carries the signal. To allow the conductive layer 30 to continue carrying the reference ground, the conductive layer 142 is electrically isolated from the conductive layer 30. In further detail, unlike the embodiment of FIG. 3, there is no via to couple the conductive layer 142 to the conductive layer 30.

Figure 5:
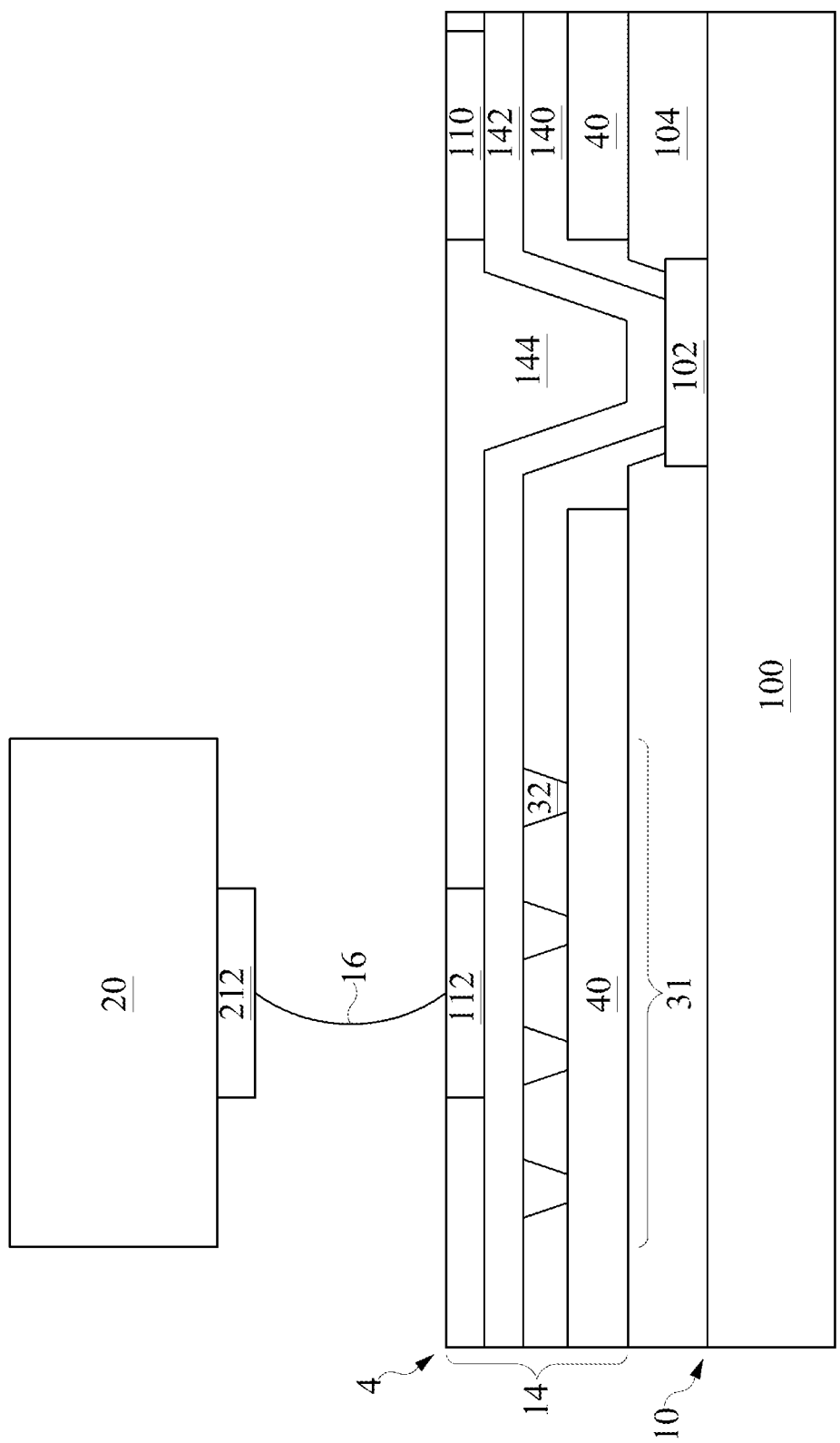
FIG. 5 is a cross-sectional diagram of another packaged semiconductor device taken along a same line as the line A-A shown in FIG. 1, in accordance with some embodiments of the present disclosure.

FIG. 5 is a cross-sectional diagram of another packaged semiconductor device including a semiconductor device 4, taken along a same line as the line A-A shown in FIG. 1, in accordance with some embodiments of the present disclosure. Referring to FIG. 5, the semiconductor device 4 is similar to the semiconductor device 3 described and illustrated with respect to FIG. 3 except that, for example, the semiconductor device 4 includes a conductive layer 40.

The conductive layer 40 extends on the passivation layer 104, and extends out of the projection area 31. An entire surface of the passivation layer 104 is substantially covered by the conductive layer 40. As a result, even though the first die 10 and the second die 20 operate at the relatively high operation frequency at the same time, not only does the first die 10 no longer exhibit the RF interference from the second die 20, but the second die 20 no longer exhibits the RF interference from the first die 10.

Figure 6:
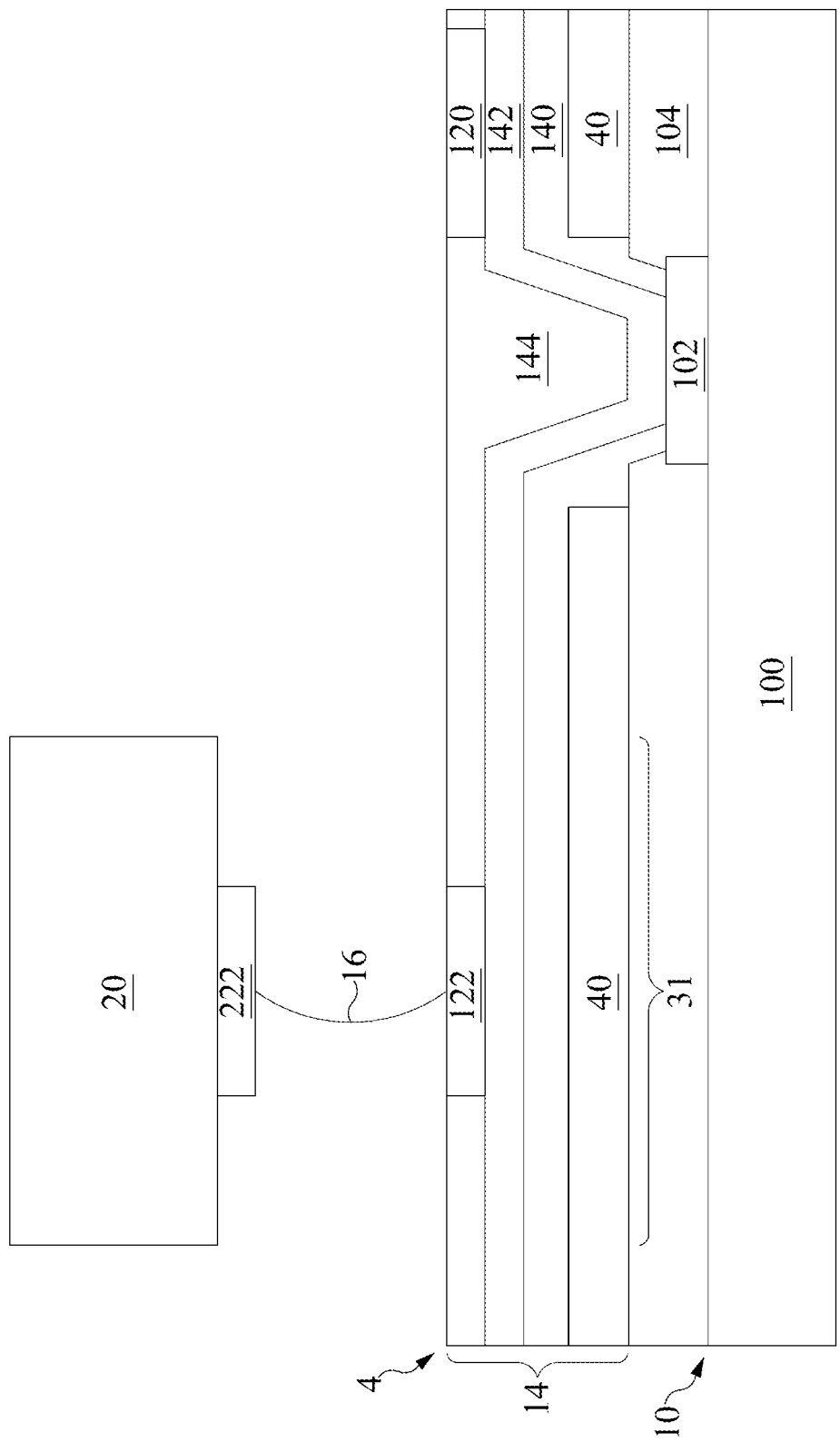
FIG. 6 is a cross-sectional diagram of the packaged semiconductor device shown in FIG. 5 taken along a same line as the line B-B shown in FIG. 1, in accordance with some embodiments of the present disclosure.

FIG. 6 is a cross-sectional diagram of the packaged semiconductor device shown in FIG. 5, taken along a same line as the line B-B shown in FIG. 1, in accordance with some embodiments of the present disclosure. Referring to FIG. 6, similar to the embodiment of FIG. 5, the conductive layer 40 extends on the passivation layer 104, and extends out of the projection area 31. An entire surface of the passivation layer 104 is substantially covered by the conductive layer 40.

Figure 7:
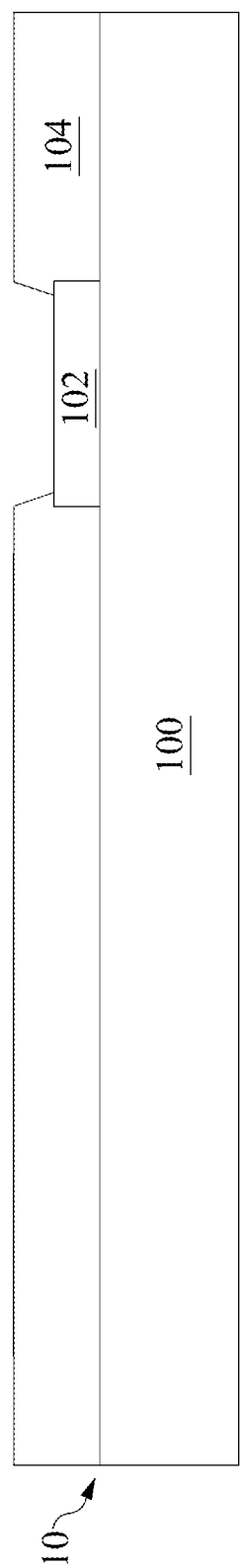
FIGS. 7 through 12 illustrate the cross-sectional views of intermediate stages in the formation of a packaged semiconductor device, in accordance with some embodiments of the present disclosure.

FIGS. 7 through 12 illustrate the cross-sectional views of intermediate stages in the formation of a packaged semiconductor device, in accordance with some embodiments of the present disclosure. Referring to FIG. 7, a first die 10 is provided. In further detail, a substrate 100 is provided, and integrated circuit dies are formed thereon. Next, a pad 102 is formed on the substrate 102 by any suitable process, such as a deposition and etching, damascene or dual damascene, or the like with any suitable conductive material, such as aluminum. Next, the passivation layer 104 is formed on the substrate 100 and the pad 102 by, for example, a pattern process.

Figure 8:
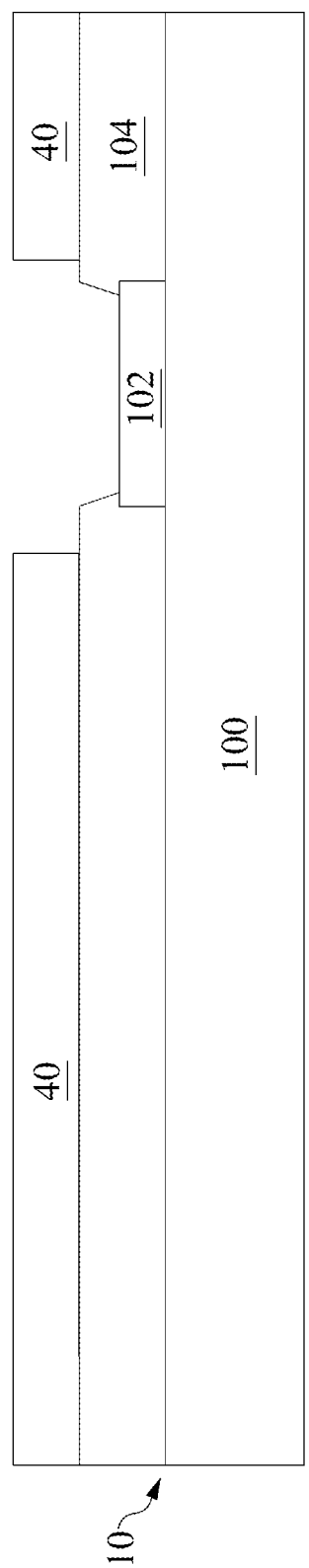

Referring to FIG. 8, a conductive layer 40 is formed on the passivation layer 104 by, for example, a sputtering process.

Figure 9:
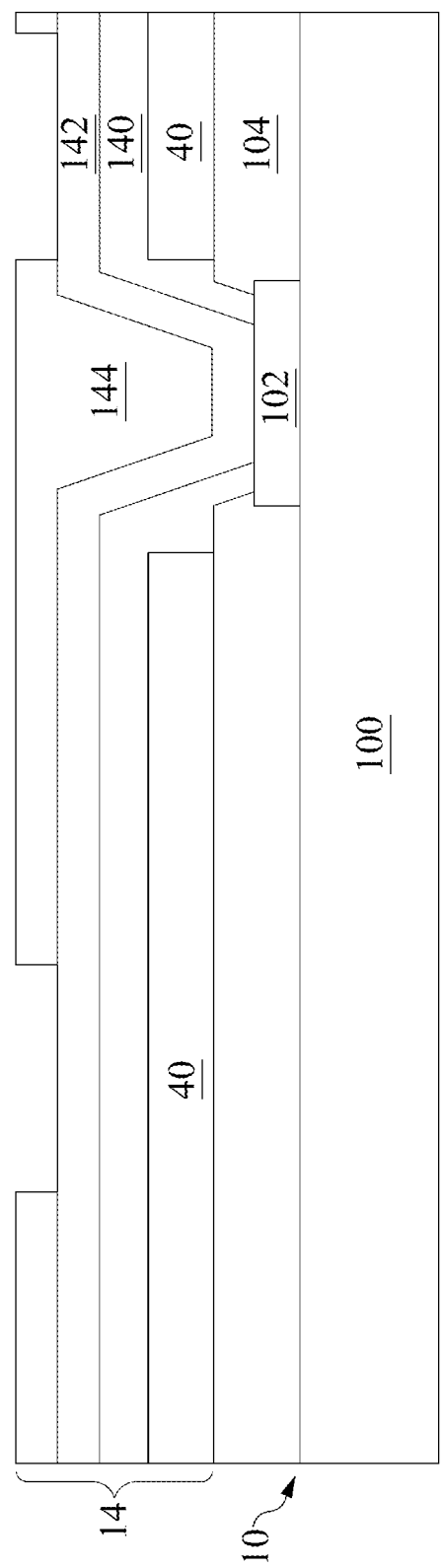

Referring to FIG. 9, a redistribution structure 14 is formed on the conductive layer 40 and the pad 102 by, for example, a pattern process.

Figure 10:
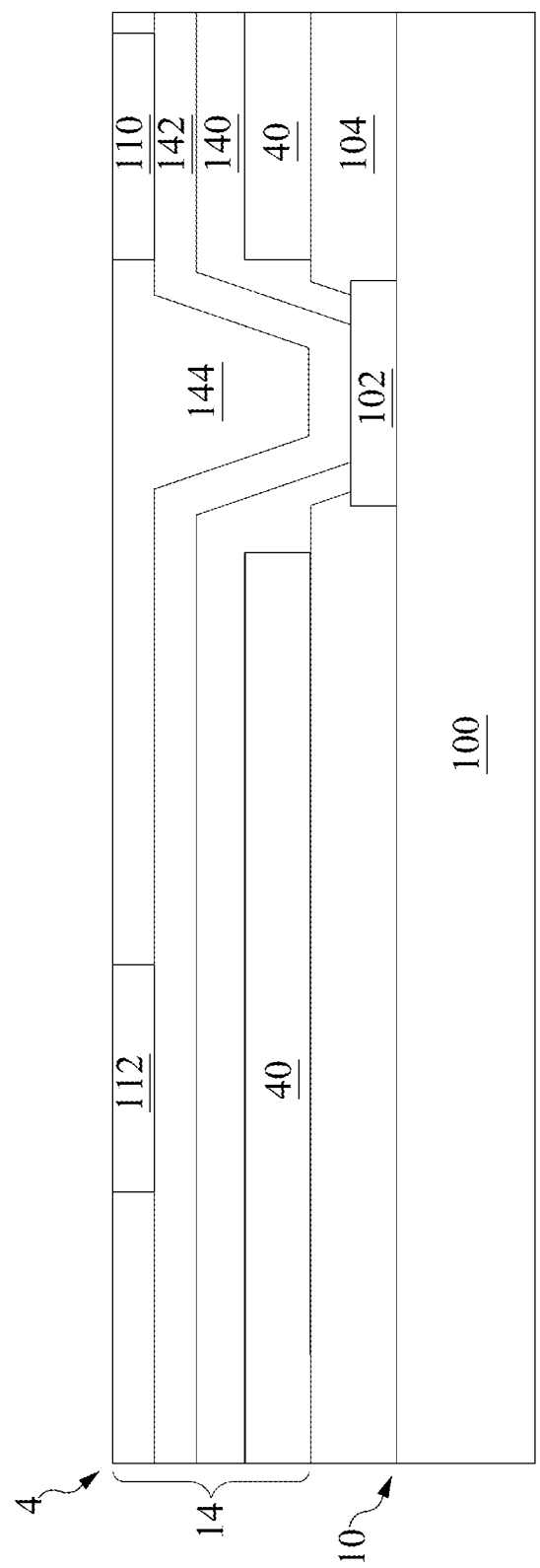

Referring to FIG. 10, pads 110 and 112 are formed in the redistribution structure 14.

Figure 11:
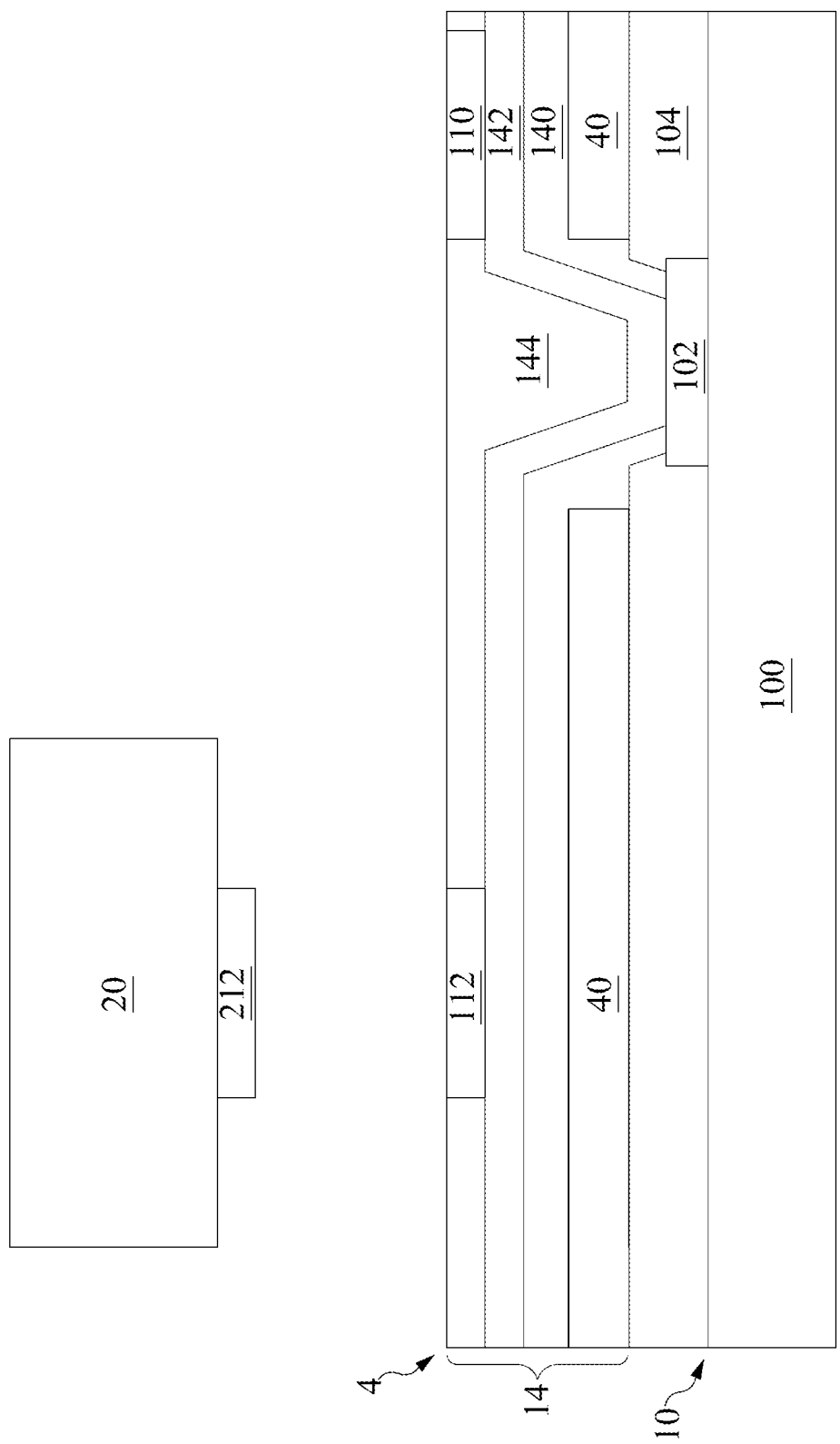

Referring to FIG. 11, a second die 20 having a pad 212 thereon is provided.

Figure 12:
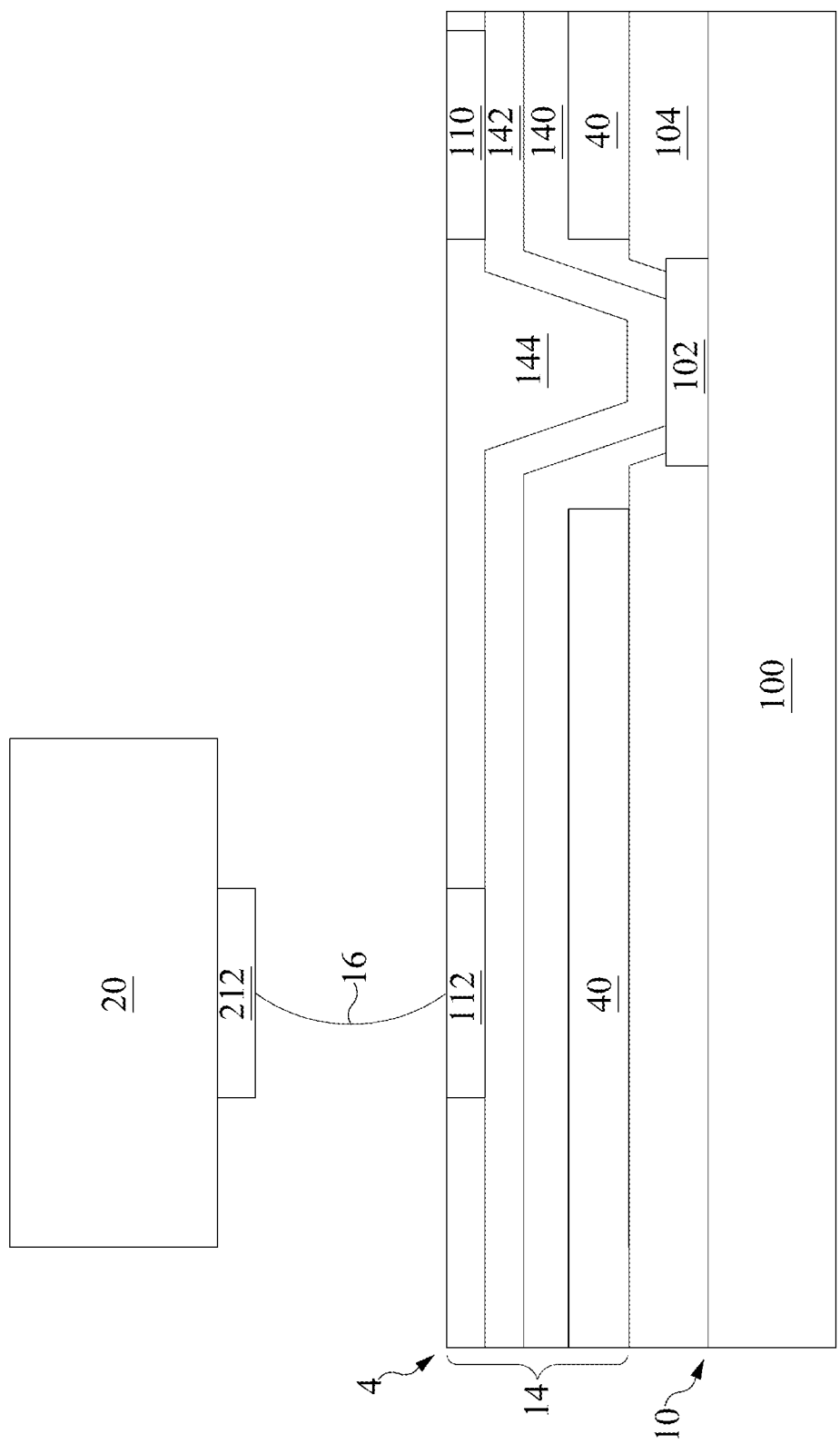

Referring to FIG. 12, the second die 20 is bonded to the first die 10 via a wire 16 by, for example, a wire-bonding process.

Figure 13:
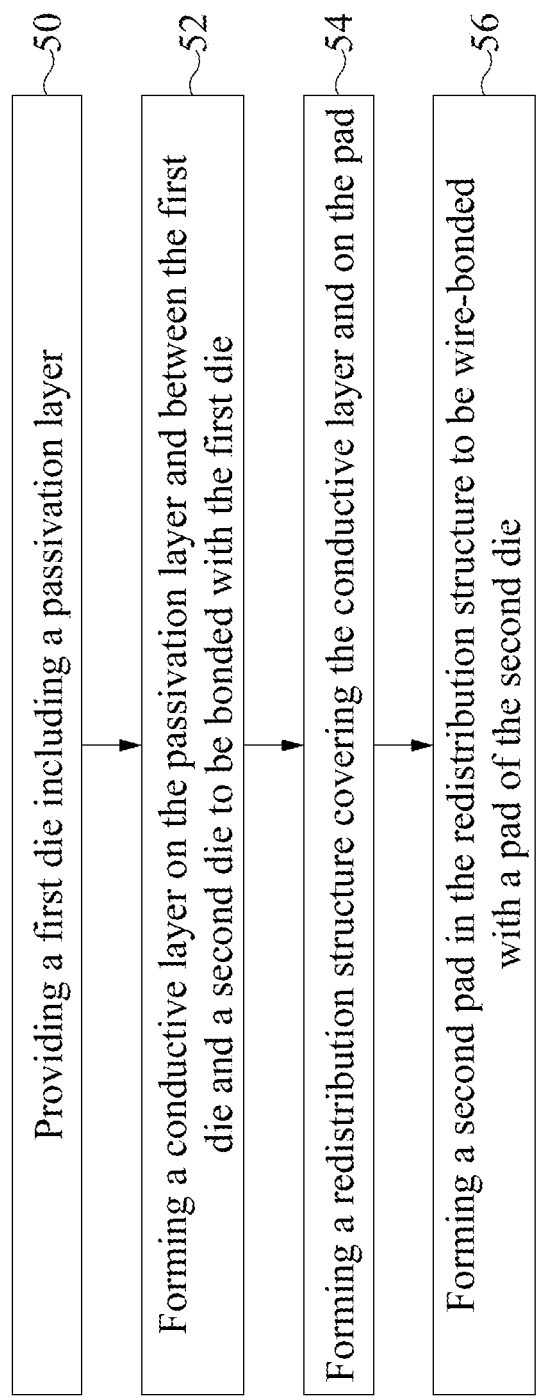
FIG. 13 is a flowchart of a method of forming a packaged semiconductor device, in accordance with some embodiments of the present disclosure.

FIG. 13 is a flowchart of a method 5 of forming a packaged semiconductor device, in accordance with some embodiments of the present disclosure. Referring to FIG. 5, the method 5 includes operations 50, 52, 54 and 56.

The method 5 begins with operation 50, in which a first die including a passivation layer is provided.

The method 5 proceeds to operation 52, in which a conductive layer is formed on the passivation layer and between the first die and a second die to be bonded with the first die The method 5 continues with operation 54, in which a redistribution structure is formed on the pad. Moreover, the redistribution structure covers conductive layer.

The method 5 proceeds to operation 56, in which a second pad to be wire-bonded with a pad of the second die is formed in the redistribution structure.

The method 5 is merely an example, and is not intended to limit the present disclosure beyond what is explicitly recited in the claims. Additional operations can be provided before, during, and after the method 5, and some operations described can be replaced, eliminated, or moved around for additional embodiments of the method.

In the comparative semiconductor device 2, if both the first die 10 and the second die 20 operate at a relatively high operation frequency, the first die 10 and the second die 20 will exhibit a radio frequency (RF) interference with each other.

In the present disclosure, the conductive layer 30 is able to effectively shield the first die 10 from the second die 20. As a result, even though the first die 10 and the second die 20 operate at the relatively high operation frequency at the same time, the first die 10 no longer exhibits the RF interference from the second die 20. Moreover, there is no need to significantly modify a circuit design. The original circuit design can still be used, with the only changes being the addition of the conductive layer 30 and the via 32, which reduces a burden on a circuit designer.

One embodiment of the present disclosure provides a semiconductor device. The semiconductor device includes a first die and a conductive layer. The first die is configured to be bonded with, in a direction, a second die external to the semiconductor device. The conductive layer, between the first die and the second die in the direction, is configured to implement a reference ground.

Another embodiment of the present disclosure provides a semiconductor device. The semiconductor device includes a first die and a conductive layer and a redistribution structure. The conductive layer, extending and disposed on the first die, configured to implement a reference ground. The redistribution structure covers and surrounds the conductive layer.

Another aspect of the present disclosure provides a method. The method includes providing a first die, and forming a conductive layer on the first die and between the first die and a second die to be bonded with the first die.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a first die configured to be bonded with, in a direction, a second die which is external to the semiconductor device, wherein the second die includes a first pad;
a conductive layer, between the first die and the second die in the direction; and
a redistribution structure, between the first die and the second die, configured for routing the first die, the redistribution structure encapsulating and covering the conductive layer, wherein the redistribution structure includes a second pad and a third pad which is apart from the second pad, the second pad provides a reference ground to the third pad which is coupled to the first pad of the second die via a wire, and the conductive layer is configured to receive and implement the reference ground;
wherein the conductive layer fully occupies at least a projection area, wherein the projection area is defined by projecting the second die, which is to be bonded with the first die, onto the first die.

2. The semiconductor device of claim 1, wherein the conductive layer is a first conductive layer, and wherein the redistribution structure includes:
a second conductive layer configured to be electrically isolated from the first conductive layer when the second conductive layer carries a signal other than the reference ground.

3. The semiconductor device of claim 1, wherein the conductive layer is a first conductive layer, and wherein the redistribution structure includes:
a second conductive layer configured to be coupled to the first conductive layer when the second conductive layer carries the reference ground.

4. The semiconductor device of claim 3, wherein the redistribution structure further includes a dielectric layer on the first conductive layer, and wherein the semiconductor device further includes:
a via, in the dielectric layer, configured to couple the first conductive layer to the second conductive layer.

5. The semiconductor device of claim 1, wherein the conductive layer extends out of a projection area, wherein the projection area is defined by projecting the second die to be bonded with the first die onto the first die.

6. The semiconductor device of claim 1, wherein the conductive layer is a first conductive layer, and wherein the redistribution structure includes:
a second conductive layer configured to be electrically isolated from the first conductive layer when the second conductive layer carries a signal other than the reference ground.

7. The semiconductor device of claim 1, wherein the conductive layer is a first conductive layer, and wherein the redistribution structure includes:
a second conductive layer configured to be coupled to the first conductive layer when the second conductive layer carries the reference ground.

8. The semiconductor device of claim 7, wherein the redistribution structure further includes a dielectric layer on the conductive layer, and wherein the semiconductor device further includes:
a via, in the dielectric layer, configured to couple the first conductive layer to the second conductive layer.

9. The semiconductor device of claim 1, wherein the first die includes a passivation layer, wherein the conductive layer is on the passivation layer.

10. The semiconductor device of claim 1, wherein the conductive layer includes Cu, and the conductive layer has a mesh structure.

11. A semiconductor device, comprising:
a first die;
a conductive layer, extending and disposed on the first die; and
a redistribution structure, between the first die and the second die, configured for routing the first die, the redistribution structure covering and encapsulating the conductive layer, wherein the redistribution structure includes a second pad and a third pad which is apart from the second pad, the second pad provides a reference ground to the third pad, and the conductive layer is configured to receive and implement the reference ground;
wherein the conductive layer fully occupies at least a projection area, wherein the projection area is defined by projecting a second die, which is to be bonded with the first die, onto the first die.

12. The semiconductor device of claim 11, wherein the conductive layer is a first conductive layer, and wherein the redistribution structure includes:
a dielectric layer covering the conductive layer; and
a second conductive layer disposed on the dielectric layer, wherein the semiconductor device further comprising:
a via disposed in the dielectric layer, wherein the second conductive layer provides the reference ground to the first conductive layer via the via.

13. The semiconductor device of claim 11, wherein the first die includes a passivation layer on a top surface of the first die, and the passivation layer is in contact with the conductive layer.

14. A method, comprising:
providing a first die;
forming a conductive layer on the first die fully occupying at least a projection area;
forming a redistribution structure above the first die, the redistribution structure covering and encapsulating the conductive layer;
forming a second pad and a third pad in the redistribution structure, wherein the third pad is apart from the second pad, the second pad provides a reference ground to the third pad;
providing a second die having a first pad; and
bonding the second die to the first die via coupling the first pad and the third pad which are coupled via a wire;
wherein the conductive layer is located between the first die and the second die to be bonded with the first die;
wherein the redistribution structure is located between the first die and the second die;
wherein the projection area is defined by projecting the second die, which is to be bonded with the first die, onto the first die.

* * * * *